(12) United States Patent
Boureau et al.

(10) Patent No.: US 6,646,358 B1
(45) Date of Patent: Nov. 11, 2003

(54) DEVICE FOR TRANSFERRING AND SUPPORTING PANELS

(75) Inventors: Damien Boureau, Rouen (FR); Xavier Clement, Louviers (FR)

(73) Assignee: Automa-Tech, Val de Reuil (FR)

( * ) Notice: Subject to any disclaimer, the term of this patent is extended or adjusted under 35 U.S.C. 154(b) by 320 days.

(21) Appl. No.: 09/688,969

(22) Filed: Oct. 16, 2000

(30) Foreign Application Priority Data

Nov. 3, 1999 (FR) .............................................. 99 13726

(51) Int. Cl.[7] .............................................. H01L 23/58
(52) U.S. Cl. ...................................... 257/798; 250/492.2
(58) Field of Search ............................... 257/664, 670, 257/674, 678, 687, 798; 250/492.1, 453.11, 492.2

(56) References Cited

U.S. PATENT DOCUMENTS

| | | | | |
|---|---|---|---|---|
| 4,555,630 A | * | 11/1985 | Sheets et al. ............ | 250/492.1 |
| 4,749,867 A | * | 6/1988 | Matsushita et al. ...... | 250/442.1 |
| 5,606,172 A | * | 2/1997 | Morita et al. ............ | 250/492.2 |

* cited by examiner

*Primary Examiner*—Wael Fahmy
*Assistant Examiner*—(Vikki) Hoa B. Trinh
(74) *Attorney, Agent, or Firm*—O'Melveny & Myers LLP

(57) ABSTRACT

The invention relates to a transfer and support device for a double-sided panel, in particular a printed circuit panel. The device comprises a bottom slab having a top reference surface that is plane and horizontal for receiving the bottom face of panel; a top slab having a bottom reference surface that is plane and horizontal for receiving the top face of panel; and for moving slabs separately in two respective horizontal planes, each of being provided with controllable for pressing a face of panel against the reference surface of slab when they are activated. The device also has controllable for lifting panel.

8 Claims, 3 Drawing Sheets

DEVICE FOR TRANSFERRING AND SUPPORTING PANELS

The present invention relates to a device for transferring and supporting panels, in particular printed circuit panels, and to the use of the device in an installation for exposing said panels to a source of radiation.

BACKGROUND OF THE INVENTION

Printed circuit manufacture includes, in particular, a step of using various techniques to etch a deposit of copper made on one or two faces of an insulating panel so as to define the conductor tracks of the printed circuit.

Firstly, such panels can be of large dimensions, e.g. 610 mm×762 mm, whereas the present trend is for the thickness thereof to become smaller since they can commonly be as little as 50 µm thick, and in exceptional circumstances as little as 5 µm thick. It will be understood that handling such panels is difficult.

Secondly, when printed circuit panels are double-sided, it is necessary to etch them on both faces. When the etching step consists in exposing the panel to a light source through an artwork that defines the shape of the conductor tracks, it is possible to perform this operation simultaneously on both faces of the printed circuit panel.

New techniques for etching conductor tracks are presently becoming more popular, which techniques consist in replacing the operation of exposure through an artwork by an operation in which the layer of photosensitive material or "resist" deposited on the sheet of conductive material is treated by moving a laser beam, with the impact of the laser beam giving rise to local transformation of the resist layer making it possible, once the non-transformed portion of the resist layer has been removed, to etch the layer of conductive material. However, under such circumstances, it is not possible to perform this laser beam operation simultaneously on both faces of the printed circuit. It is therefore necessary to present each face of the panel in succession in the exposure machine.

In other techniques, the laser beam ablates the resist layer directly, or indeed no resist layer is used and the laser beam ablates the conductive layer directly.

It will also be understood that given the dimensions and the small thickness of such a panel, turning it over to enable both of its faces to be presented in succession in the machine raises great difficulties. Furthermore, it will be understood that a station for turning the panel over would lead to a significant increase in volume and thus in the overall bulk of the exposure machine as a whole once account is taken of the transfer means that would need to be associated therewith to make the operation entirely automatic, and that it would also lengthen the time required to perform the operations.

OBJECTS AND SUMMARY OF THE INVENTION

An object of the present invention is to provide a device for transferring and supporting double-sided panels, and in particular printed circuit panels, that enables each of the faces of the panel to be presented and positioned in succession in the exposure machine, while avoiding the drawbacks of a machine operating on the principle of turning the panel over.

To achieve this object, the invention provides a device for transferring and supporting a double-sided panel, in particular a printed circuit panel, the device comprising:

a bottom slab having a top reference surface that is plane and horizontal for receiving the bottom face of said panel;

a top slab having a bottom reference surface that is plane and horizontal for receiving the top face of said panel; and displacement means for moving said slabs separately in two respective horizontal planes;

each of said slabs being provided with non-mechanical holder means that are controllable for pressing one face of said panel against the reference surface of said slab, when the holder means are activated;

said device further comprising controllable lifting means for controlling said panel, said lifting means not projecting from the reference surface of a slab when they are in a non-activated state, and being suitable for pressing said panel against the reference surface of said top slab when they are activated.

It will be understood that because of the presence of the top and bottom slabs, each face of the panel can be inserted into the exposure machine while maintaining very precise positioning of the panel in the vertical direction. The reference surfaces of each of the panels can be machined with very great precision and this positioning in the vertical direction is maintained because the panels are merely displaced in a horizontal direction.

In a preferred embodiment, the holder means are suction micro-nozzles opening out in the reference surface of said slab and regularly distributed over said surface.

Also preferably, the lifting means are micro-actuators disposed regularly in the reference surface of said bottom slab, each micro-actuator having a moving rod that moves in a direction orthogonal to the reference surface, said rods when in the non-activated position being completely withdrawn relative to said reference surface.

By using suction micro-nozzles and lifting micro-actuators, firstly the panel can be kept plane even if it is very thin, and secondly the panel can be transferred from one slab to the other slab without any risk of imparting localized deformation to the panel, since that would be incompatible with the type of treatment it is to receive.

Another object of the invention is to provide an installation for exposing a double-sided printed circuit panel to a source of radiation, which installation makes use of the above-defined transfer and support device.

BRIEF DESCRIPTION OF THE DRAWINGS

Other characteristics and advantages of the invention will appear more clearly on reading the following description of various embodiments of the invention given as non-limiting examples. The description refers to the accompanying figures, in which.

MORE DETAILED DESCRIPTION

Figure 1A:
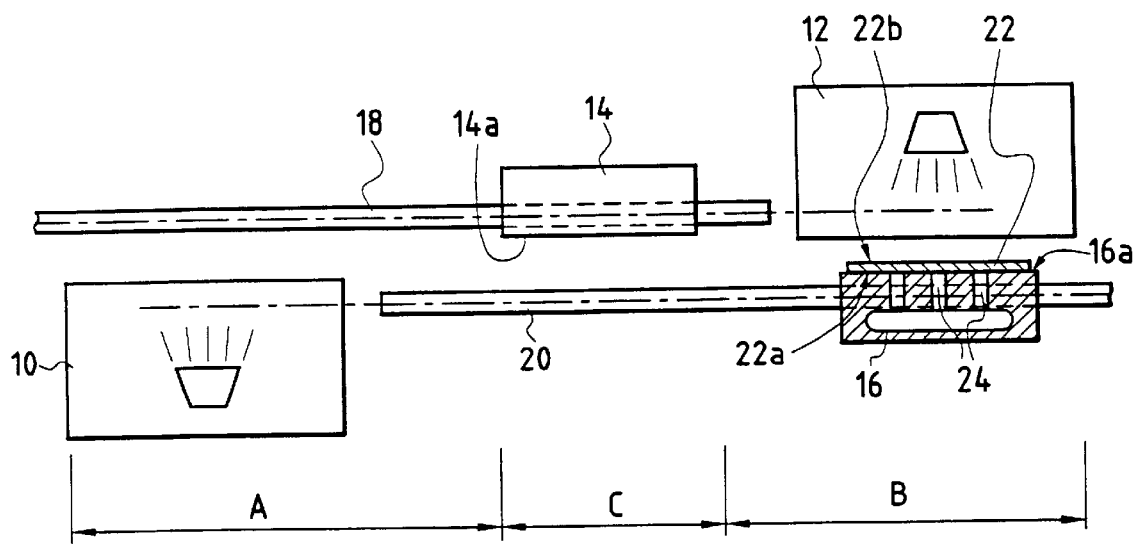
FIGS. 1A to 1C show the principle of the invention when it is applied to an exposure machine, in particular for exposure to a laser beam.
Figure 1B:
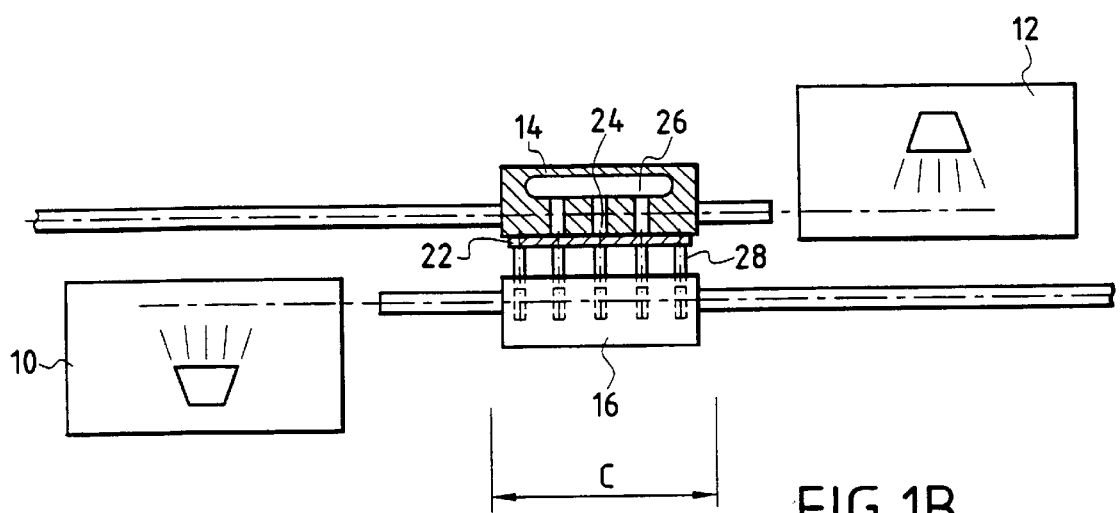
Figure 1C:
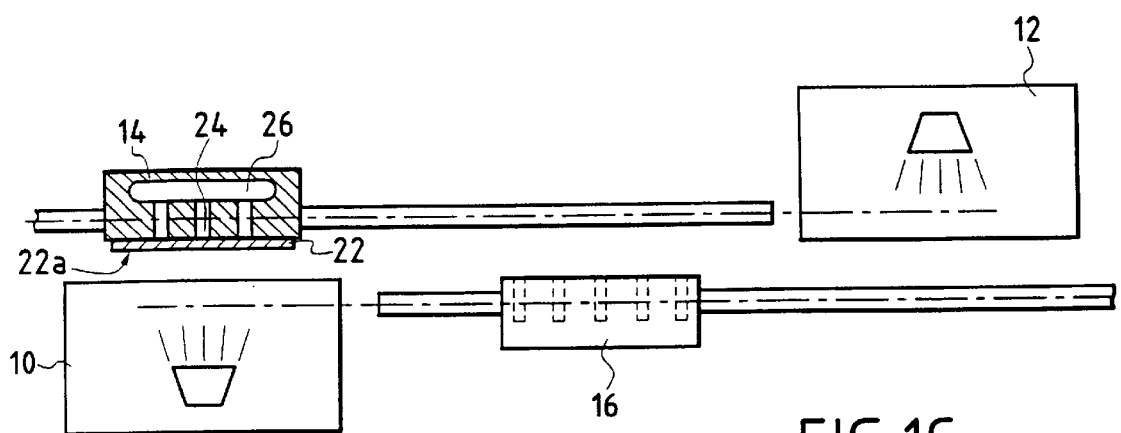

With reference initially to FIGS. 1A to 1C, the transfer and support device used in the context of an installation for exposing printed circuit panels to a laser beam is described as a whole. The installation has a bottom optical unit 10 for treating the bottom face of the panel and a top optical unit 12 for treating the top face of the same panel. The bottom and top units 10 and 12 are offset from each other in a horizontal plane so as to occupy zones identified by letters A and B, with a transfer zone C being left between the zones A and B.

Installations for exposing printed circuits to laser beams form part of a technique which is now well known and which consists in treating the resist layer deposited on the metal layer of the printed circuit by means of a laser beam and which, by means of its points of impact, modifies the state of the resist layer so as to enable it subsequently to be removed from locations that have not been struck by the laser beam. Thereafter, chemical etching steps serve to remove the conductive layer only in areas that have been exposed.

An exposure installation also covers machines in which the laser beam acts directly to ablate desired zones of the resist layer or indeed machines in which no resist layer is used and the laser beam serves to ablate desired zones of the conductive layer directly.

The exposure machine could also be one of conventional type in which the top face and the bottom face of the panel are exposed by two different assemblies.

The transfer and support device proper is essentially constituted by two slabs, respectively a top slab 14 and a bottom slab 16 which are constrained to move in parallel horizontal planes defined by top horizontal rails 18 and by bottom horizontal rails 20. More precisely, the top rails 18 enable the slab 14 to move between the transfer zone C and the zone A which corresponds to the bottom optical unit 10, and the bottom rails 20 enable the bottom slab 16 to move horizontally between the transfer zone C and the zone B which is occupied by the top optical unit 12.

The slabs have respective reference surfaces 14a and 16a which are accurately horizontal and present a high degree of planeness. It will be understood that these characteristics of being plane and horizontal are maintained regardless of the position of the slab 14 or of the slab 16. These reference surfaces 14a and 16a are designed to receive respective faces of the panel to be treated. These reference surfaces are thus of dimensions greater than the greatest dimension of the panel to be treated.

The installation operates as follows. Initially, the panel, e.g. a printed circuit panel 22, is placed with its bottom face 22a resting on the reference surface 16a of the bottom slab 16. This slab is moved to face the top optical unit 12. The slab also serves as a support for the printed circuit panel 22 while its top face 22b is being exposed.

In the next step, the bottom slab 16 is moved into the transfer zone C where it faces the top slab 14. In this position, the panel 22 is lifted off the bottom slab 16 and pressed against the reference surface 14a of the top slab 14 and is held in this position. This is shown in FIG. 1B. Finally, the top slab 14 is moved so as to brought into the zone A of the bottom optical unit 10. In this position, the top slab 14 also serves as a support for the panel 22 while its bottom face 22a is being exposed to the laser beam. After this operation, it will be understood that the top and bottom faces of the panel 22 have been treated in succession, so the entire exposure operation has been performed.

In order to enable the panel to be held against the reference surfaces 16a and 14a of the slabs 16 and 14, the slabs are preferably fitted with suction means represented diagrammatically by nozzles 24 and 26 which open out respectively into the reference surfaces of the top and bottom slabs. These suction means are described in detail below. To hold the panel against the reference surface of a slab, other means could be used, e.g. mechanical or magnetic means. Nevertheless, this solution using suction appears to be preferable.

To enable the panel 22 to be lifted from the bottom slab 16 to the top slab 14, the bottom slab 16 is fitted with lifting means preferably constituted by vertically-displaceable micro-actuators 28. Actuating these micro-actuators enables the entire panel to be lifted by means of its bottom face so as to bring its top face into contact with the reference surface 14a of the top slab 14. In the non-activated state, the rods of the micro-actuators are retracted relative to the reference surface. To enable the panel to be lifted from the bottom slab up to the top slab, it would also be possible to use magnetic means secured to the top slab or jets of air under pressure produced by the bottom slab. It would also be possible to provide mechanical means external to the bottom slab. Nevertheless, the solution using micro-actuators appears to be preferable.

Figure 2:
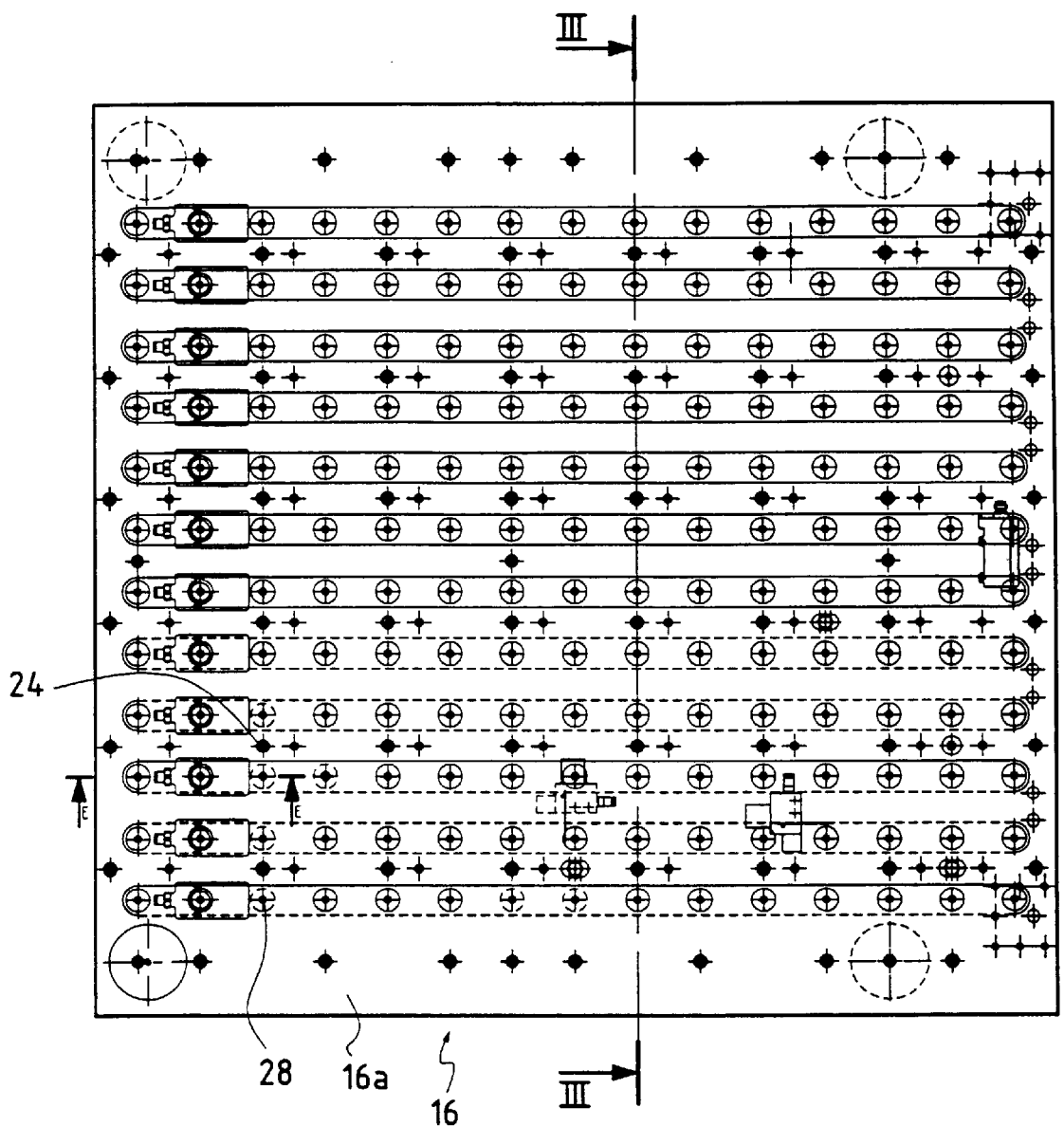
FIG. 2 is a plan view of the reference surface of a slab.

FIG. 2 shows a preferred embodiment of the bottom slab 16, this figure showing more particularly the reference surface 16a of the slab. In this figure, there can be seen the ends of the suction nozzles 24 which are disposed in parallel lines. The suction nozzles are preferably of the type in which suction is interrupted if the outlet of the nozzle is not obstructed by a portion of the article to be held. Similarly, in this figure, there can also be seen the ends of the micro-actuators 28 which are likewise disposed in lines that are parallel to the lines of suction nozzles.

It is important to state the suction nozzles are distributed regularly over the reference surface, that they have orifices of small diameter, and that there are very many of them. It should also be understood firstly that by controlling the nozzles the entire panel is held in uniformly distributed manner against the reference surface. Secondly, the small diameter of the nozzles does not significantly alter the planeness of the reference surface. In the same manner, the end sections of the micro-actuators are of small diameter and these micro-actuators are regularly distributed and there are very many of them. It should thus be understood that that while the panel is being lifted, even though it is very thin, it is held accurately plane until it is pressed against the bottom reference face of the top slab 14. In this position, putting the suction nozzles of the top slab 14 into operation serves to secure the panel against the bottom reference face of the top slab with the planeness of the panel continuing to be maintained.

Figure 3:
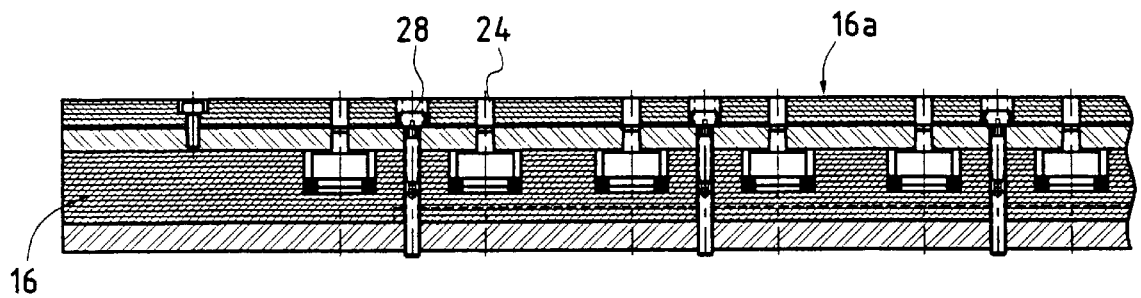
FIG. 3 is a longitudinal section view of a slab on line III—III of FIG. 2.

FIG. 3 shows a preferred embodiment of the bottom slab 16. This view shows the micro-actuators 28 and the suction nozzles 24.

Figure 4:
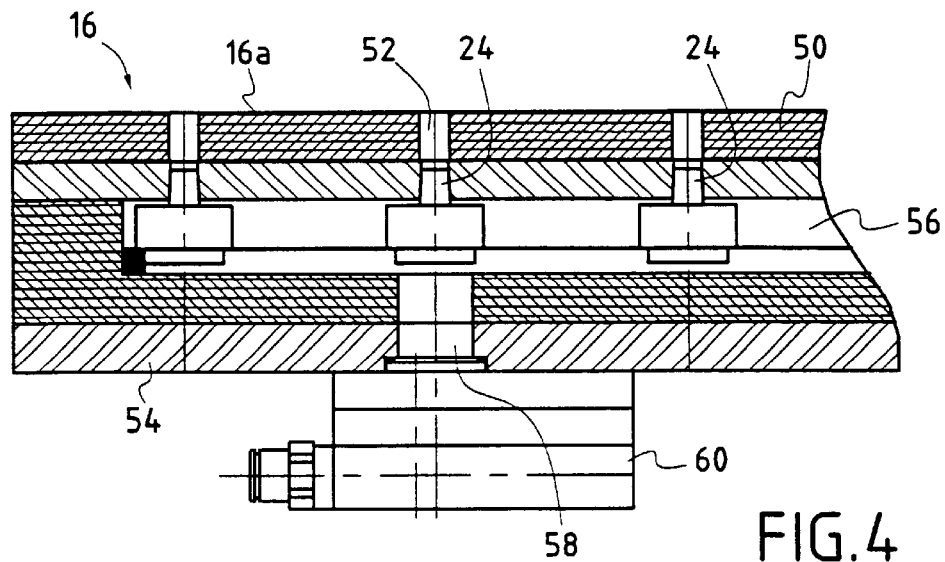
FIG. 4 is a vertical section view of a micro-actuator.

As can be seen more clearly in FIG. 4, the slab 16 has a top plate 50 constituting the reference surface 16a and pierced by holes 52 corresponding to the suction nozzles 24. It also has a bottom plate 54 which defines recesses 56 for positioning the suction network.

This recess communicates with an orifice 58 formed in the bottom plate 54 and connected to a vacuum pump 60.

Figure 5:
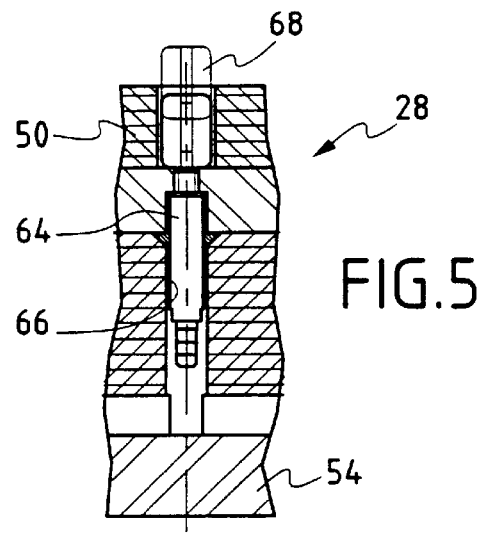
FIG. 5 is a vertical section view of a micro-nozzle.

FIG. 5 shows a micro-actuator 28 whose rod 64 is slidably mounted in a recess 66 in the top plate of the slab. The rod 64 is terminated by a head 68 preferably made of PVC so as to avoid damaging the printed circuit panel. In this figure, the head 68 is shown in its extended position.

What is claimed:

1. A device for transferring and supporting a double-sided panel having a bottom face and a top face, in particular a printed circuit panel, said device comprising:

a bottom slab having a top reference surface that is plane and horizontal for receiving the bottom face of said panel;

a top slab having a bottom reference surface that is plane and horizontal for receiving the top face of said panel;

displacement means for moving said slabs separately in two respective horizontal planes;

each of said slabs being provided with non-mechanical holder means that are controllable for pressing one face of said panel against the reference surface of said slab, when the holder means are activated; and controllable lifting means for controlling said panel, said lifting means not projecting from the reference surface of either slab when it is in a non-activated state, and being suitable for pressing said panel against the reference surface of said top slab when it is activated, whereby said top surface of said panel is exposed when said panel is disposed on said bottom slab and said bottom surface of said panel is exposed when said panel is disposed on said top slab.

2. The device according to claim 1, wherein said holder means are suction micro-nozzles opening out in the reference surfaces of said slabs and regularly distributed over said surfaces.

3. The device according to claim 1, wherein said lifting means is a plurality of micro-actuators disposed regularly in the reference surface of said bottom slab, each micro-actuator having a moving rod that moves in a direction orthogonal to the reference surface, said rods when in the non-activated position being completely withdrawn relative to said reference surface.

4. The device according to claim 1, wherein said lifting means is mounted on said bottom slab.

5. A device for transferring and supporting a double-sided panel having a bottom face and a top face, in particular a printed circuit panel, said device comprising:

a bottom slab having a top reference surface that is planar and horizontal for receiving the bottom face of said panel;

a top slab having a bottom reference surface that is planar and horizontal for receiving the top face of said panel;

displacement means for moving said slabs separately in two respective horizontal planes;

each of said slabs being provided with non-mechanical holder means that are controllable for pressing one face of said panel against the reference surface of said slab, when the holder means are activated; and controllable lifting means mounted on said bottom slab for controlling said panel, said lifting means not projecting from the reference surface of said bottom slab when it is in a non-activated state, and being suitable for pressing said panel against the reference surface of said top slab when it is activated.

6. The device according to claim 5, wherein said holder means comprises suction micro-nozzles opening out in the reference surfaces of said slabs and regularly distributed over said surfaces.

7. The device according to claim 5, wherein said lifting means comprises a plurality of micro-actuators disposed regularly in the reference surface of said bottom slab, each micro-actuator having a moving rod that moves in a direction orthogonal to the reference surface, said rods when in the non-activated position being completely withdrawn relative to said reference surface.

8. The device according to claim 5, wherein said top slab and said bottom are moved in two distinct, fixed horizontal planes.

* * * * *